United States Patent
Sorin et al.

(10) Patent No.: US 9,973,283 B2
(45) Date of Patent: May 15, 2018

(54) MODE CONVERSION FOR OPTICAL ISOLATION

(71) Applicant: Hewlett-Packard Development Company, L.P., Houston, TX (US)

(72) Inventors: Wayne Victor Sorin, Mountain View, CA (US); Sonny Vo, Palo Alto, CA (US); David A. Fattal, Mountain View, CA (US); Michael Renne Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 40 days.

(21) Appl. No.: 14/773,179

(22) PCT Filed: Apr. 11, 2013

(86) PCT No.: PCT/US2013/036117
§ 371 (c)(1),
(2) Date: Sep. 4, 2015

(87) PCT Pub. No.: WO2014/168619
PCT Pub. Date: Oct. 16, 2014

(65) Prior Publication Data
US 2016/0013870 A1 Jan. 14, 2016

(51) Int. Cl.
*G02B 6/32* (2006.01)
*G02B 6/26* (2006.01)
(Continued)

(52) U.S. Cl.
CPC .............. *H04B 10/802* (2013.01); *G02B 6/14* (2013.01); *G02B 6/4208* (2013.01);
(Continued)

(58) Field of Classification Search
CPC ...... H01S 5/423; H01S 5/005; H01S 5/02284; H01S 5/141; H01S 5/4068; H04B 10/071;
(Continued)

(56) References Cited

U.S. PATENT DOCUMENTS 6,414,973 B1 * 7/2002 Hwu .................... H01S 5/14
372/19
6,856,460 B2 2/2005 Coleman et al.
(Continued)

FOREIGN PATENT DOCUMENTS

CN 101120526 2/2008
CN 101535859 9/2009
(Continued)

OTHER PUBLICATIONS

Brown, S.N., "Theory and Simulation of Subwavelength High Contrast Gratings and Their Applications in Vertical-Cavity Surface-Emitting Laser Devices," (Research Paper), 2011, available at https://www.ideals.illinois.edu/bitstream/handle/2142/29808/Brown_Stephen.pdf?sequence=1.
(Continued)

*Primary Examiner* — Kaveh C Kianni
*Assistant Examiner* — Hung Lam
(74) *Attorney, Agent, or Firm* — Tarolli, Sundheim, Covell & Tummino, L.L.P.

(57) ABSTRACT

An optical coupling system includes an optical signal source to provide an optical signal from an aperture. The system also includes a substantially planar high-contrast grating (HCG) lens to convert an optical mode of the optical signal to provide a converted optical signal having a mode-isolating intensity profile. The system further includes an optical element to receive the converted optical signal. The optical signal source and the substantially planar HCG lens can be arranged to substantially mitigate coupling of a reflected optical signal associated with the converted optical signal that is reflected from the optical element to the aperture of the optical signal source based on a reflected mode-isolating intensity profile.

18 Claims, 4 Drawing Sheets

(51) Int. Cl.
  G02B 6/42      (2006.01)
  G02B 6/34      (2006.01)
  G02B 6/30      (2006.01)
  G02B 6/36      (2006.01)
  H04B 10/80     (2013.01)
  H04B 10/2581   (2013.01)
  H04B 10/50     (2013.01)
  G02B 6/14      (2006.01)
  H04B 10/67     (2013.01)
  H01S 5/022     (2006.01)
  H01S 5/183     (2006.01)

(52) U.S. Cl.
  CPC ......... *H04B 10/2581* (2013.01); *H04B 10/50* (2013.01); *H04B 10/671* (2013.01); *H01S 5/02284* (2013.01); *H01S 5/183* (2013.01)

(58) Field of Classification Search
  CPC ...... H04B 10/40; H04B 10/60; H04B 10/801; H04B 10/802; H04B 10/2581; H04B 10/671; H04B 10/50
  USPC ..... 385/31, 33–35, 88–93; 398/212; 359/15, 359/19, 558, 565
  See application file for complete search history.

(56) References Cited

U.S. PATENT DOCUMENTS

| | | | |
|---|---|---|---|
| 9,530,905 B2* | 12/2016 | Wang | H01L 31/02363 |
| 2007/0153860 A1 | 7/2007 | Chang-Hasnain et al. | |
| 2011/0008062 A1 | 1/2011 | Ashdown | |
| 2011/0280269 A1 | 11/2011 | Chang-Hasnain et al. | |
| 2013/0272337 A1* | 10/2013 | Tan | H01S 5/02284 372/107 |
| 2015/0010271 A1* | 1/2015 | Fattal | G02B 6/34 385/14 |

FOREIGN PATENT DOCUMENTS

| | | |
|---|---|---|
| CN | 101990747 | 3/2011 |
| CN | 102959442 | 3/2013 |
| KR | 20090078798 A | 7/2009 |
| WO | WO-2011093890 | 8/2011 |
| WO | WO-2011106553 A2 | 9/2011 |
| WO | WO-2012087282 A1 | 6/2012 |
| WO | WO-2012144997 | 10/2012 |
| WO | WO-2012149441 A2 | 11/2012 |

OTHER PUBLICATIONS

Chang-Hasnain, C.J. et al., "High-contrast Gratings for Integrated Optoelectronics," (Web Page), 2012, pp. 379-440, vol. 4, No. 3, available at http://www.opticsinfobase.org/aop/fulltext.cfm?uri=aop-4-3-379&id=241175.

International Search Report & Written Opinion received in PCT Application No. PCT/US2013/036117, dated Jan. 23, 2014, 10 pages.

CN First Office Action dated Oct. 24, 2016, CN Patent Application No. 201380075159.3 dated Sep. 28, 2015, State Intellectual Property Office of the P.R. China, 6 pages.

Extended European Search Report dated Nov. 15, 2016 for EP Application No. 13881834.9; pp. 6.

International Preliminary Report on Patentability received in PCT Application No. PCT/US2013/036117, dated Oct. 22, 2015, 7 pages.

* cited by examiner

MODE CONVERSION FOR OPTICAL ISOLATION

BACKGROUND

Optical communications have become more prevalent as the demand for high-speed communication and processing has increased. Data communication links can include optical coupling of an optical signal to an optical fiber via a laser or another optical fiber to provide the optical signal to a destination device for processing. Data communication links for communication speeds of 10 gigabits per second (Gbps) can be implemented to have a coupling efficiency that is substantially low (e.g., approximately 6 dB) due to eye safety requirements. Data communication links can be implemented for higher speeds (e.g., 25 Gbps), but may require greater coupling efficiency to substantially mitigate receiver noise and modulation extinction ratios, and may be limited to use in backplane applications to remove the eye safety requirement based on the higher coupling efficiency.

DETAILED DESCRIPTION

Figure 1:
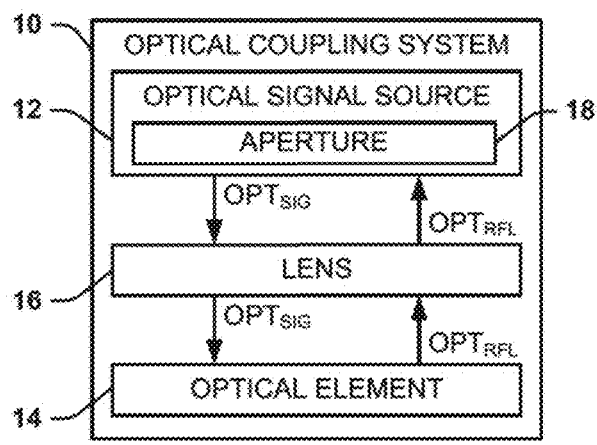
FIG. 1 illustrates an example of an optical coupling system.

FIG. 1 illustrates an example of an optical coupling system 10. The optical coupling system 10 can be implemented in any of a variety of optical communications systems to couple a modulated optical signal $OPT_{SIG}$ provided by an optical signal source 12 into an optical element 14 via a lens 16. For example, portions of the optical coupling system 10 can be implemented in an optical device package as an optical transmitter system that can be mounted on a backplane or printed circuit board (PCB) to provide high-speed optical communication in a computer system. As an example, the optical coupling system 10 can be implemented in a high speed (e.g., 25 Gbps or more) optical communications system.

The optical signal source 12 can be any of a variety of optical devices that can provide the optical signal $OPT_{SIG}$. As an example, the optical signal source 12 can be a laser. For example, the laser could be a spatially single-mode or multi-mode laser, such as a vertical-cavity surface-emitter laser (VCSEL), a Fabry-Perot laser, or a distributed feedback (DFB) laser. The laser can be configured to provide the modulated optical signal $OPT_{SIG}$ based on an electric signal that modulates data into the modulated optical signal $OPT_{SIG}$. As another example, the optical signal source 12 can be a single-mode or multi-mode optical fiber. The modulated optical signal $OPT_{SIG}$ can be emitted from an aperture 18 of the optical signal source 12.

As an example, the optical signal source 12 can be implemented to provide high-speed (e.g., 25 Gbps or more) optical communications. Thus, the arrangement of the optical signal source 12 with respect to the optical element 14 can be sufficient to maximize coupling associated with the optical signal $OPT_{SIG}$ into the optical element 14, as described herein, to facilitate the high-speed communication. As described herein, an optical element is any of a variety of devices that can receive an optical signal (e.g., the optical signal $OPT_{SIG}$) for further propagation of the optical signal or for demodulation and/or processing of the optical signal. For example, the optical element 14 can be configured as a multi-mode optical fiber, such as to receive the optical signal $OPT_{SIG}$ from the optical signal source 12 that is configured as a laser. As another example, the optical element 14 can be configured as a PIN diode (e.g., photodetector), such as to receive the optical signal $OPT_{SIG}$ from the optical signal source 12 that is configured as an optical fiber (e.g., single-mode or multi-mode). The optical signal $OPT_{SIG}$ that is provided by the optical signal source 12 can thus be coupled into the optical element 14 via the lens 16.

In response to optimization of the coupling of the optical signal $OPT_{SIG}$ into the optical element 14, optical energy associated with the optical signal $OPT_{SIG}$ can be reflected back toward the optical signal source 12 through the lens 16, demonstrated in the example of FIG. 1 as a reflected optical signal $OPT_{RFL}$. The reflected optical signal $OPT_{RFL}$ thus represents optical energy of the optical signal $OPT_{SIG}$ that is reflected back from the optical element 14. If the reflected optical signal $OPT_{RFL}$ is coupled into the aperture 18 of the optical signal source 12, and thus interferes with the resonating optical energy therein, relative intensity noise (RIN) associated with the optical signal $OPT_{SIG}$ can be substantially increased. Therefore, to substantially mitigate RIN associated with the reflected optical signal $OPT_{RFL}$, the lens 16 can be configured to convert the optical modes associated with the optical signal $OPT_{SIG}$, and thus the reflected optical signal $OPT_{RFL}$, to higher orders to provide the reflected optical signal $OPT_{RFL}$ as having a reflected intensity profile that spatially isolates the optical modes of the reflected optical signal $OPT_{RFL}$. Therefore, the amount of optical energy of the reflected optical signal $OPT_{RFL}$ that is coupled to the aperture 18 of the optical signal source 12 is substantially mitigated based on the reflected mode-isolating intensity profile. As an example, reflected mode-isolating intensity profile is configured to spatially isolate the optical energy of the higher order modes from the aperture 18.

For example, the lens 16 can be configured as a substantially planar high-contrast grating (HCG) lens that is configured to selectively phase-delay portions of the optical signal $OPT_{SIG}$ that is incident thereon to provide the optical mode isolation of the intensity profile. As described herein, an HCG lens can be defined as a lens comprising a plurality of resonant structures composed of a material having a high index-of-refraction, such that a difference between the index-of-refraction of the resonant structures and the index-of-refraction of a surrounding material is greater than or equal to one. As an example, the reflected mode-isolating intensity profile can be arranged as a substantially off-axis intensity profile (e.g., an approximate ring shape). As described herein, a substantially off-axis intensity profile is an intensity profile that substantially mitigates an amount of optical energy at a cross-sectional axis of the aperture 18. As a result, the reflected optical signal $OPT_{RFL}$ that is reflected back through the lens 16 and coupled to the aperture 18 of the optical signal source 12 can be substantially mitigated based on the substantially off-axis intensity profile with respect to the aperture 18 of the optical signal source 12.

Figure 2:
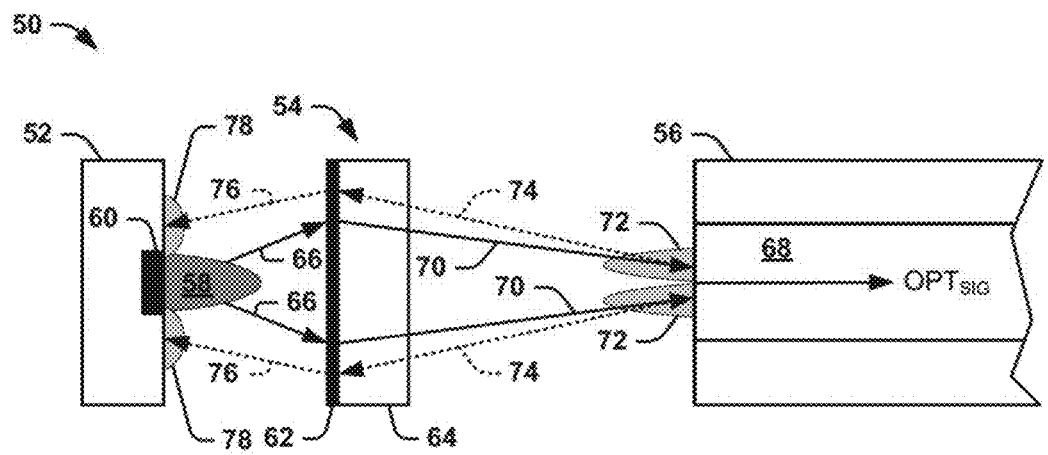
FIG. 2 illustrates another example of an optical coupling system.

FIG. 2 illustrates another example of an optical coupling system 50. The optical coupling system 50 is demonstrated in a plan view and can correspond to the optical coupling system 10 in the example of FIG. 1. For example, the optical coupling system 50 can be mounted on a PCB or a backplane to provide high-speed (e.g., 25 Gbps or more) optical communication in a computer system.

The optical coupling system 50 includes a VCSEL 52, an HCG lens 54, and a multi-mode fiber 56. The VCSEL 52 can be configured to generate an optical signal 58 having a mode distribution that is emitted from an aperture 60. As an example, the VCSEL 52 can be implemented to provide high-speed (e.g., 25 Gbps or more) optical communications. Thus, the optical signal 58 can have an optical power that is sufficient to substantially maximize optical coupling into the multi-mode fiber 56, as described herein, to facilitate the high-speed communication. As an example, the multi-mode fiber 56 can be provided via a connector, such as to provide the multi-mode fiber 56 to a package that includes the VCSEL 52 and the HCG lens 54. The optical signal 58 that is generated by the VCSEL 52 is thus incident on the HCG lens 54, demonstrated by the solid lines 66, and is thus focused and launched into a core 68 of the multi-mode fiber 56 via the HCG lens 54, demonstrated in the example of FIG. 2 as the optical signal $OPT_{SIG}$ propagating in the core 68 of the multi-mode fiber 56.

In the example of FIG. 2, the HCG lens 54 is configured as a substantially planar HCG lens that includes a high index-of-retraction material layer 62 that includes a plurality of resonant structures on a dielectric layer 64. The plurality of resonant structures can be formed from a variety of high index-of-refraction materials, such as amorphous silicon, gallium arsenide (GaAs), or indium phosphide (InP). As an example, the dielectric layer 64 can be glass (e.g., $SiO_2$). For example, the plurality of resonant structures can be surrounded by air, or can be surrounded by another material having an index-of-refraction that is less than the index-of-refraction of the high index-of-refraction material layer 62 by at least one. Accordingly, the HCG lens 54 operates as a lens to convert the optical modes of the optical signal based on the portions of the light resonating in the resonant structures, as described herein.

The HCG lens 54 is configured to increase the optical modes of the optical signal 58 to convert the optical signal 58 to having a mode-isolating intensity profile. In the example of FIG. 2, the mode-isolating intensity profile is demonstrated as an approximate ring shape as focused by the HCG lens 54, demonstrated by the solid lines 70. For example, the resonant structures of the high index-of-refraction layer 62 can be etched as a plurality of posts that cooperate to provide selective phase-changes to the optical signal 58. In the example of FIG. 2, the approximately ring-shaped intensity profile is demonstrated at 72. The approximately ring-shaped intensity profile of the optical signal 58 is thus coupled into a core 68 of the multi-mode fiber 56.

In the example of FIG. 2, a portion of the optical energy of the optical signal 58 is reflected back from the core 68 of the multi-mode fiber 56, demonstrated by the dashed lines 74. The reflected optical energy 74 is thus provided back to the HCG lens 54 and is focused toward the VCSEL 52, demonstrated by the dashed lines 76. The reflected optical energy 76 that is focused by the HCG lens 54 maintains the approximately ring-shaped intensity profile as it is provided incident on the VCSEL 52, demonstrated as the approximately ring-shaped intensity profile 78. As a result, the approximately ring-shaped intensity profile substantially surrounds the aperture 60 to isolate the modes of the reflected optical energy 74 from the aperture 60. Thus, coupling of the optical energy of the reflected optical energy 76 with the aperture 60 is substantially mitigated. Accordingly, RIN of the optical signal 58 can be substantially mitigated.

Figure 3:
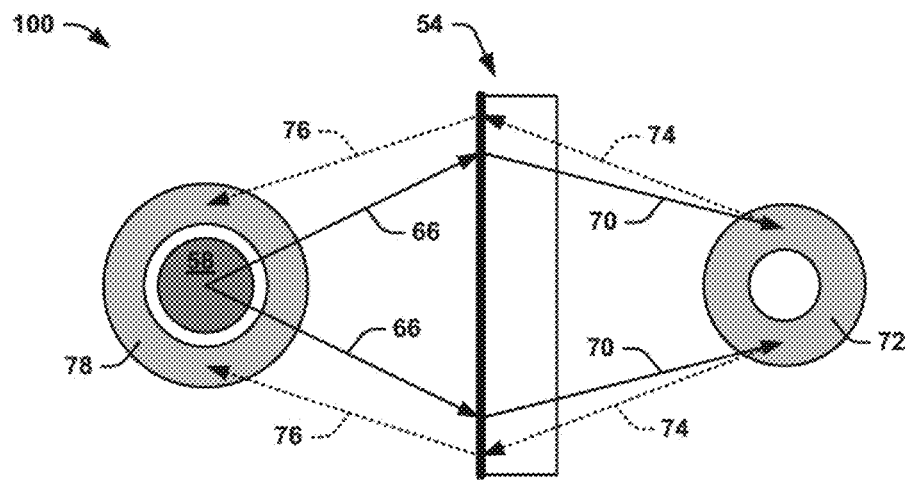
FIG. 3 illustrates an example diagram of mode isolation.

FIG. 3 illustrates an example diagram 100 of mode isolation. The diagram 100 demonstrates the intensity profiles of the optical signal 58 in a cross-sectional manner across both sides of the HCG lens 54. Thus, reference is to be made to the example of FIG. 2 in the following description of the example of FIG. 3.

The diagram 100 includes the optical signal 58, demonstrated as substantially circular, that is provided to the HCG lens 54 (e.g., by the solid lines 66). The HCG lens 54 is configured to increase the optical modes of the optical signal 58 to convert the optical signal 58 to the mode-isolating intensity profile, demonstrated in the example of FIG. 3 as the approximately ring-shaped intensity profile 72, that is focused onto the core 68 of the multi-mode fiber 56 (not shown in the example of FIG. 3), demonstrated by the solid lines 70. A portion of the optical energy of the optical signal 58 is reflected back to the HCG lens 54, demonstrated as the dashed lines 74. The HCG lens 54 maintains the reflected mode-isolating intensity profile as the approximately ring-shaped intensity profile 72 that is incident on the core 58 as it focuses the optical energy 74 back to the VCSEL 52 (not shown in the example of FIG. 3), which is demonstrated as the approximately ring-shaped intensity profile 78 provided by the dashed lines 76. Accordingly, the approximately ring-shaped intensity profile 78 can substantially surround the aperture 60 of the VCSEL 52, and is therefore substantially off-axis with respect to the aperture 60.

It is to be understood that the optical coupling system 50 is not intended to be limited to the examples of FIGS. 2 and 3. For example, the optical coupling system 50 could include, for example, two or more HCG lenses 54 between the VCSEL 52 and the multi-mode fiber 56, such as to provide a collimated beam between the lenses. In addition, it is to be understood that the reflected mode-isolating intensity profile of the optical signal 58 is not intended to be limited to the approximate ring shape demonstrated by 72 and 78, but could instead be a variety of other types of substantially off-axis intensity profiles. As an example, the HCG lens 54 can be fabricated in a variety of ways to provide sufficient phase-delays of the optical signal 58 to substantially distribute the optical energy away from the aperture 60. For example, the reflected mode-isolating intensity profile could instead be a shape other than substantially circular, such as square, rectangular, hexagonal, or a variety of other shapes. As another example, the reflected mode-isolating intensity profile could be an interrupted pattern that substantially surrounds an approximate center point, such as to maintain substantially minimal coupling of the optical energy with the aperture 60. Furthermore, it is to be understood that a small portion of the optical energy that is reflected back to the VCSEL 52 can still be coupled into the aperture 60, such as based on misalignment and/or relative spacing of the VCSEL 52, the HCG lens 54, and/or the multi-mode fiber 56.

Figure 4:
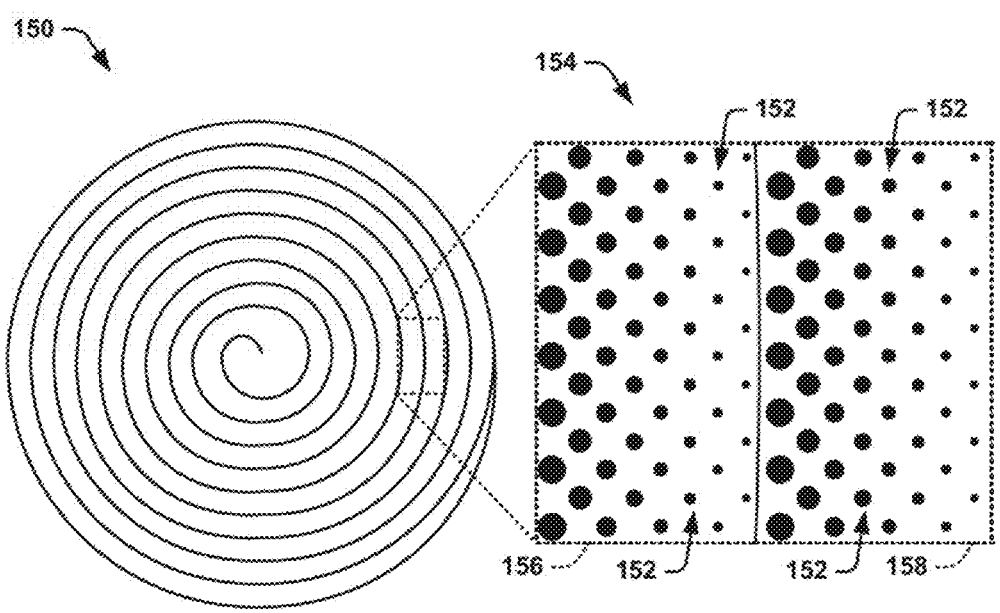
FIG. 4 illustrates an example of a lens.

As described previously, the respective phase-delays added to the portions of the optical signal 58 can result from the manner in which the HCG lens 54 is fabricated. FIG. 4 illustrates an example of a lens 150. The lens 150 can correspond to the HCG lens 54 in the example of FIGS. 2 and 3. Therefore, reference is to be made to the examples of FIGS. 2 and 3 in the following description of the example of FIG. 4. In the example of FIG. 4, the lens 150 is demonstrated in a top-view of a substantially planar surface of the lens 150. The lens 150 is demonstrated as circular in the top view of the example of FIG. 4. However, the lens 150 can instead have a variety of different geometric shapes. As an example, the lens 150 can have a diameter sufficient to focus substantially all or most of the optical signal 58 (e.g., approximately 250 µm).

The lens 150 includes a layer of a high index-of-refraction material (e.g., amorphous silicon) provided as a plurality of resonant structures that are substantially defined by a plurality of gradient patterns to provide mode isolation of incident optical energy. In the example of FIG. 4, the lens 150 is demonstrated as having the resonant structures arranged as a spiral pattern defined as having a plurality of gradient patterns (e.g., loops) along a radius of the lens 150. As described herein, a loop of the spiral pattern is a given portion of the spiral pattern that traverses 360° around the center of the spiral pattern from a given angle, and thus the loop ends a greater distance along the radius of the lens 150 relative to the start of the loop. In the example of FIG. 4, the plurality of resonant structures can be provided as a plurality of posts 152 that are arranged as having a thickness (i.e., wafer thickness) that is substantially uniform on a substrate layer of a dielectric material (e.g., glass). For example, the thickness of the plurality of posts 152 that constitute the approximate spiral pattern in the example of FIG. 4 can have a thickness that depends on the wavelength of the light constituting the optical signal 58 (e.g., approximately 480 nm diameter for $\lambda$=850 nm; approximately 340 nm diameter for $\lambda$=630 nm). As an example, the high index-of-refraction posts 152 can be surrounded by air, or can be surrounded by another material having an index-of-refraction that is less than the index-of-refraction of the posts 152 by at least one. Accordingly, the posts 152 cooperate to convert the optical modes of the optical signal 58 based on the portions of the light resonating in the posts 152 to provide selective phase-delay of the optical signal 58.

In the example of FIG. 4, the posts 152 are demonstrated as approximately cylindrical (i.e., round in the top-view of the example of FIG. 4) in an exploded view 154. For example, the posts 152 can be formed by etching the layer of the high index-of-refraction material. The posts 152 in each gradient pattern (e.g., loop) of the spiral pattern can have a width (e.g., cross-sectional diameter) that is a function of an approximate gradient of decreasing size from center of the lens 150 to a periphery of the lens 150. The width of the posts 152 can be sub-wavelength with respect to the light of the optical signal 58, and can be selected to provide selective phase-delay of the optical signal 58, such as to provide an angular momentum to generate the approximately ring-shaped intensity profile. For example, the width of the posts 152 can range, for example, from approximately 100 nm to approximately 400 nm. The exploded view 154 demonstrates an inner loop 156 and an adjacent outer loop 158 on which the posts 152 are pattern-etched. The inner loop 156 and the outer loop 158 each include posts 152 that each have a width that decreases from left-to-right (e.g., from center of the lens 150 to the outer periphery of the lens 150). Accordingly, optical energy of the optical signal 58 can resonate within the posts 152 to provide the selective phase-delay of the optical signal 58, such as to provide the approximately ring-shaped intensity profile.

Figure 5:
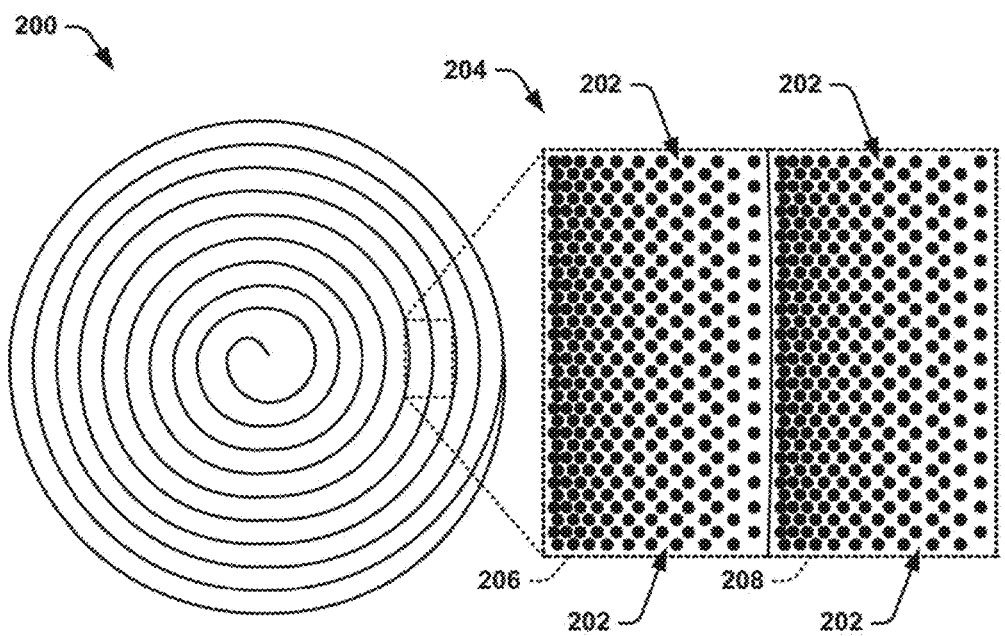
FIG. 5 illustrates another example of a lens.

FIG. 5 illustrates another example of a lens 200. The lens 200 can correspond to the HCG lens 54 in the example of FIGS. 2 and 3. In the example of FIG. 5, the lens 200 is demonstrated in a top-view of a substantially planar surface of the lens 200. The lens 200 is demonstrated as circular in the top view of the example of FIG. 5. However, the lens 200 can instead have a variety of different geometric shapes. As an example, the lens 200 can have a diameter sufficient to focus substantially all or most of the optical signal 58 (e.g., approximately 250 µm).

Similar to as described previously regarding the example of FIG. 4, the lens 200 includes a layer of a high index-of-refraction material (e.g., amorphous silicon) provided as a plurality of resonant structures that are substantially arranged to provide mode-isolation of incident optical energy, such as a spiral pattern defined as having a plurality of gradient patterns (e.g., loops) along a radius of the lens 200. In the example of FIG. 5, the plurality of resonant structures can be provided as a plurality of posts 202 that are arranged as having a thickness (i.e., wafer thickness) that is substantially uniform on a substrate layer of a dielectric material (e.g., glass). As an example, the high index-of-refraction posts 202 can be surrounded by air, or can be surrounded by another material having an index-of-refraction that is less than the index-of-refraction of the posts 202 by at least one. Accordingly, the posts 202 cooperate to convert the optical modes of the optical signal 58 based on the portions of the light resonating in the posts 202 to provide selective phase-delay of the optical signal 58.

In the example of FIG. 5, the posts 202 are demonstrated as approximately cylindrical (i.e., round in the top-view of the example of FIG. 4) in an exploded view 204. For example, the posts 202 can be formed by etching the layer of the high index-of-refraction material. The posts 202 in each gradient pattern (e.g., loop) of the spiral pattern can have a width (e.g., diameter) that is substantially uniform and populate the substrate with a density that is based on a function of an approximate gradient of decreasing density from center of the lens 200 to a periphery of the lens 200. The substantially uniform width of the posts 202 can be sub-wavelength with respect to the light of the optical signal 58 (e.g., approximately 200 nm), and the density of the population of the posts 152 can be selected to provide selective phase-delay of the optical signal 58, such as to provide an angular momentum to generate the approximately ring-shaped intensity profile. The exploded view 204 demonstrates an inner loop 206 and an adjacent outer loop 208 on which the posts 202 are pattern-etched. The inner loop 206 and the outer loop 208 each include posts 202 that populate the substrate with a density that decreases from left-to-right (e.g., from center of the lens 200 to the outer periphery of the lens 200). Accordingly, optical energy of the optical signal 58 can resonate within the posts 202 in a variable manner based on the variable density of population of the posts 202 to provide the selective phase-delay of the optical signal 58, such as to provide the approximately ring-shaped intensity profile.

By implementing the lens 150 in the example of FIG. 4 and the lens 200 in the example of FIG. 5 as a substantially planar HCG, the lenses 150 and 200 can be fabricated in a much less expensive manner than conventional lenses that include convex surfaces. For example, wafer-scale processing can be simpler and more cost effective than processes to fabricate conventional convex and diffractive element lenses. In addition, because lenses 150 and 200 are implemented as HCG lenses, as opposed to typical diffractive lenses that can be fabricated from standard (e.g., lower) index of refraction materials (e.g., glass), the HCG lenses 150 and 200 can provide a much greater coupling efficiency and differential mode coupling than conventional diffractive lenses.

It is to be understood that the lenses 150 and 200 are not intended to be limited to the examples of FIGS. 4 and 5. As an example, the lenses 150 and 200 are not limited to including a spiral pattern arrangement of the resonant structures, but could instead include a variety of other types of arrangements. For example, the resonant structures could be provided in a different arrangement of gradient patterns radially outward from a center of the respective lenses 150 and 200, such as concentric circles, ellipses, or other shapes. As another example, the gradient patterns are not limited to having the same dimensions, such as demonstrated with the loops in the examples of FIGS. 4 and 5, but could instead have varying dimensions (e.g., decreasing loop width closer to the edge of the lenses 150 and 200). As yet another example, the resonant structures could be arranged in any of a variety of other ways that provide a substantially non-uniform resonance of optical energy incident thereon to provide sufficient mode-isolation (e.g., to provide a substantially off-axis intensity profile). In addition, a given lens as described herein can incorporate posts having both a variable width, such as described in the example of FIG. 4, and a variable density of population on the substrate, such as described in the example of FIG. 5. Furthermore, the posts 152 and 202 are not limited to being substantially cylindrical, but could instead have a variety of prismatic shapes. Accordingly, the lenses 150 and 200 can be fabricated in any of a variety of ways.

Figure 6:
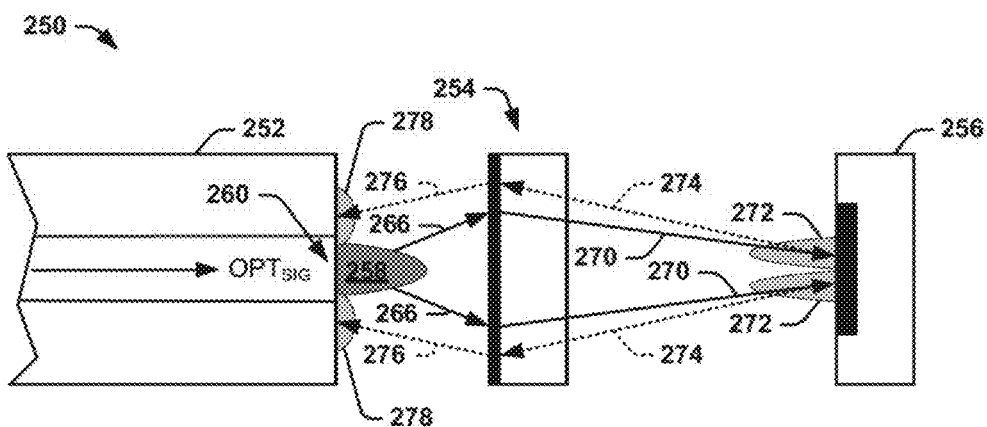
FIG. 6 illustrates yet another example of an optical coupling system.

The use of an HCG lens is not limited to an optical coupling system that provides coupling of an optical signal from a laser to a multi-mode fiber, such as described in the example of FIG. 2. FIG. 6 illustrates yet another example of an optical coupling system 250. The optical coupling system 250 is demonstrated in a plan view and can correspond to the optical coupling system 10 in the example of FIG. 1. For example, the optical coupling system 250 can be mounted on a PCB or a backplane to provide high-speed (e.g., 25 Gbps or more) optical communication in a computer system.

The optical coupling system 250 includes an optical fiber 252, an HCG lens 254, and a PIN diode 256. The optical fiber 252 can be configured to provide an optical signal 258 having a mode distribution that is emitted from an aperture 260. As an example, the optical fiber 252 can be provided via a connector, such as to provide the optical fiber 252 to a package that includes the PIN diode 256 and the HCG lens 254. The optical signal 258 that is provided by the optical fiber 252 is thus incident on the HCG lens 254, demonstrated by the solid lines 266, and is thus focused onto the PIN diode 256 via the HCG lens 254. The HCG lens 254 can be configured as a substantially planar HCG lens that includes a high index-of-refraction material layer 262 that includes a plurality of resonant structures on a dielectric layer 264, such as the lens 150 or the lens 200 in the respective examples of FIGS. 4 and 5. Accordingly, the HCG lens 254 operates to convert the optical modes of the optical signal 258 based on the portions of the light resonating in the resonant structures, as described herein.

In the example of FIG. 6, the HCG lens 254 is configured to increase the optical modes of the optical signal 258 to convert the optical signal 258 to having a mode-isolating intensity profile. Similar to as provided in the example of FIG. 2, the mode-isolating intensity profile can be a substantially off-axis intensity profile, demonstrated in the example of FIG. 6 as an approximate ring shape as focused by the HCG lens 254, demonstrated by the solid lines 270. For example, the resonant structures of the high index-of-refraction layer 262 can be etched as a plurality of posts that cooperate to provide selective phase-changes to the optical signal 258. In the example of FIG. 6, the approximately ring-shaped intensity profile is demonstrated at 272. The approximately ring-shaped intensity profile of the optical signal 258 is thus provided to the PIN diode 256.

A portion of the optical energy of the optical signal 258 is reflected back from the PIN diode 256, demonstrated by the dashed lines 274. The reflected optical energy 274 is thus provided back to the HCG lens 254 and is focused toward the optical fiber 252, demonstrated by the dashed lines 276. The reflected optical energy 276 that is focused by the HCG lens 254 maintains the approximately ring-shaped intensity profile as it is provided incident on the optical fiber 252, demonstrated as the approximately ring-shaped intensity profile 278. As a result, the approximately ring-shaped intensity profile substantially surrounds the aperture 260 to isolate the modes of the reflected optical energy 274 from the aperture 260. Accordingly, the isolation of the modes of the reflected optical signal can be implemented in both optical transmission systems and optical receiver systems.

Figure 7:
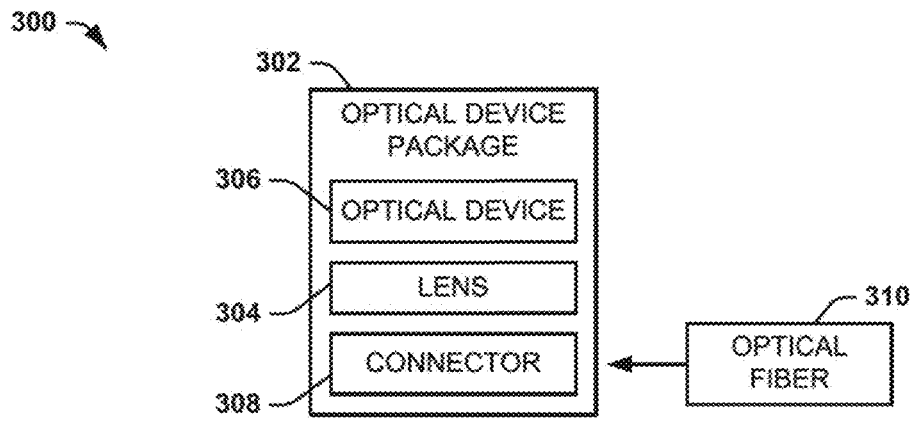
FIG. 7 illustrates yet a further example of an optical coupling system.

FIG. 7 illustrates yet a further example of an optical coupling system 300. The optical coupling system 300 can be configured as one of an optical transmission system, similar to as described in the example of FIG. 2, or an optical receiver system, similar to as described in the example of FIG. 6. The optical coupling system 300 includes an optical device package 302 that includes a lens 304, an optical device 306, and a connector 308. For example, the lens 304 can be configured as an HCG lens, similar to the lenses 150 or 200 as described in the respective examples of FIGS. 4 and 5. The connector 308 is configured to receive an optical fiber 310, which can be a multi-mode fiber or a single-mode fiber.

As an example, the optical device 306 can be configured as a laser (e.g., a VCSEL), such that the optical device 306 can generate an optical signal in an optical transmission system. Thus, the lens 304 can be configured to focus the optical signal generated by the optical device 306 to be coupled into the optical fiber 310 in an optical transmission system. As another example, the optical device 306 can be configured as a PIN diode, such that the optical fiber 310 can provide the optical signal in an optical receiver system to be demodulated based on receipt of the optical signal by the optical device 306. Thus, the lens 304 can be configured to focus the optical signal provided by the optical fiber 310 to be provided to the optical device 306 in an optical receiver system.

The optical device package 302 is not intended to be limited to including a single optical coupling system therein, such as to include only a single one of each of the lens 304, optical device 306, and connector 308. For example, the optical device package 302 can include an array of optical coupling systems, such as to include a plurality of lenses 304, a respective plurality of optical devices 306, and a respective plurality of connectors 308. Therefore, a plurality of optical fibers 310 can be coupled to the respective plurality of connectors 308. In addition, it is to be understood that the optical device package 302 is not intended to be limited to only one of optical transmission and optical receiving capability. For example, the plurality of optical devices 306 could include both VCSELs and PIN diodes, such that the optical device package 302 can be configured as an optical transceiver.

Figure 8:
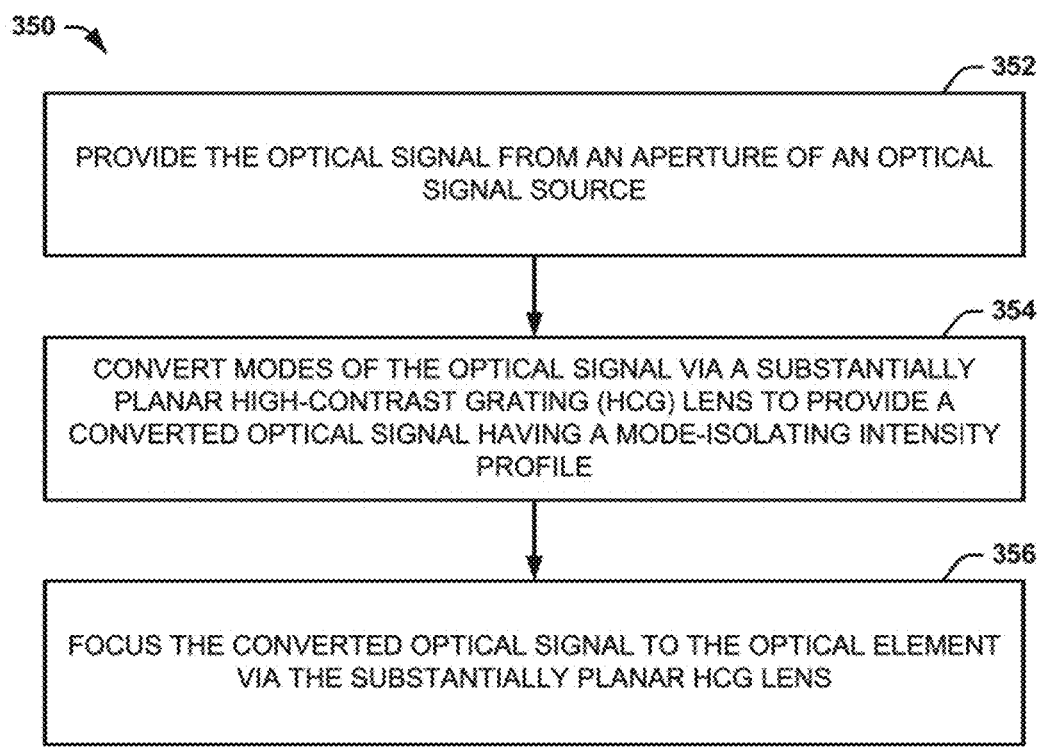
FIG. 8 illustrates a method for coupling an optical signal to a multi-mode optical fiber.

In view of the foregoing structural and functional features described above, a methodology in accordance with various aspects of the present invention will be better appreciated with reference to FIG. 8. While, for purposes of simplicity of explanation, the methodology of FIG. 8 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 350 for coupling an optical signal (e.g., the optical signal $OPT_{SIG}$) to an optical element (e.g., the optical element 14). At 352, the optical signal is provided from an aperture (e.g., the aperture 60) of an optical signal source (e.g., the optical signal source 12). At 354, modes of the optical signal are converted via a substantially planar HCG lens (e.g., the lens 16) to provide a converted optical signal having a mode-isolating intensity profile (e.g., the intensity profiles 72 and 78). The HCG lens can include a plurality of resonant structures (e.g., the posts 152) that are arranged in a pattern sufficient to provide mode-isolation. At 356, the converted optical signal is focused to the optical element via the substantially planar HCG lens. The optical signal source and the substantially planar HCG lens can be arranged to substantially mitigate coupling of a reflected optical signal associated with the converted optical signal that is reflected from the optical element to the aperture of the optical signal source based on the reflected mode-isolating intensity profile.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An optical coupling system comprising:
    an optical signal source to provide an optical signal from an aperture;
    a substantially planar high-contrast grating (HCG) lens to convert an optical mode of the optical signal to provide a converted optical signal having a mode-isolating intensity profile; and
    an optical element to receive the converted optical signal, the optical signal source and the substantially planar HCG lens being arranged to mitigate coupling of a reflected optical signal associated with the converted optical signal that is reflected from the optical element to the aperture of the optical signal source based on a reflected mode-isolating intensity profile, wherein the reflected mode-isolating intensity profile spatially isolates a higher order optical mode of the reflected optical signal from the aperture;
    wherein the substantially planar HCG lens selectively phase-delays portions of the optical signal to provide the converted optical signal having a mode-isolating intensity profile.

2. The system of claim 1, wherein the substantially planar HCG lens comprises a plurality of resonant structures that are defined by a plurality of gradient patterns along a radius of the substantially planar HCG lens.

3. The system of claim 2, wherein the plurality of resonant structures are fabricated from a first material and are substantially surrounded by a second material, wherein a difference between an index-of-refraction of the first material and an index-of-refraction of the second material is greater than or equal to one.

4. The system of claim 2, wherein the plurality of resonant structures are provided as a plurality of posts arranged on a substrate, the plurality of posts within each of the plurality of gradient patterns having a width that is defined by a gradient, such that the width of the plurality of posts decreases in a direction extending radially outward from a center of the substantially planar HCG lens in each given one of the plurality of gradient patterns.

5. The system of claim 2, wherein the plurality of resonant structures are provided as a plurality of posts arranged on a substrate, the plurality of posts within each of the plurality of gradient patterns having substantially equal width and populating the substantially planar HCG lens with a density that is defined by a gradient, such that the density of the plurality of posts populating the substantially planar HCG lens decreases in a direction extending radially outward from a center of the substantially planar HCG lens in each given one of the plurality of gradient patterns.

6. The system of claim 1, wherein the intensity profile of the optical signal is arranged as a substantially off-axis intensity profile.

7. The system of claim 1, wherein the optical signal source is a vertical-cavity surface-emitting laser (VCSEL), and wherein the optical element is a multi-mode optical fiber.

8. The system of claim 1, wherein the optical signal source is an optical fiber, and wherein the optical element is a PIN diode.

9. A mounted package comprising the substantially planar HCG lens of the optical coupling system and the optical signal source or the optical element of claim 1, wherein the other of the optical signal source or the optical element is an optical fiber, the mounted package further comprising a connector to receive the optical fiber.

10. A method for coupling an optical signal to an optical element, the method comprising:
    providing the optical signal from an aperture of an optical signal source;
    converting modes of the optical signal via a substantially planar high-contrast grating (HCG) lens to provide a converted optical signal having a mode-isolating intensity profile, the HCG lens comprising a plurality of resonant structures that are arranged in manner sufficient to substantially provide mode-isolation; and
    focusing the converted optical signal to the optical element via the substantially planar HCG lens, the optical signal source and the substantially planar HCG lens being arranged to mitigate coupling of a reflected optical signal associated with the converted optical signal that is reflected from the optical element to the aperture of the optical signal source based on a reflected mode-isolating intensity profile, wherein the reflected mode-isolating intensity profile spatially isolates an optical mode of the reflected optical signal from the aperture;
    wherein the substantially planar HCG lens selectively phase-delays portions of the optical signal to provide the converted optical signal having a mode-isolating intensity profile.

11. The method of claim 10, wherein the plurality of resonant structures are defined by a plurality of gradient patterns along a radius of the substantially planar HCG lens, the plurality of resonant structures within each of the plurality of gradient patterns having a width that is defined by a gradient, such that a dimension of the plurality of resonant structures decreases in a direction extending radially outward from a center of the substantially planar HCG lens in each given one of the plurality of gradient patterns.

12. The method of claim 10, wherein the plurality of resonant structures are defined by a plurality of gradient patterns along a radius of the substantially planar HCG lens, the plurality of resonant structures within each of the plurality of gradient patterns having substantially equal dimensions and populating the substantially planar HCG lens with a density that is defined by a gradient, such that the density of the plurality of resonant structures populating the substantially planar HCG lens decreases in a direction extending radially outward from a center of the substantially planar HCG lens in each given one of the plurality of gradient patterns.

13. An optical device package comprising:
an optical device to generate or receive an optical signal;
a connector to receive an optical fiber that is to provide or receive the optical signal; and
a substantially planar high-contrast grating (HCG) lens interconnecting the optical device and the connector, the substantially planar HCG lens being to convert an optical mode of the optical signal to provide a converted optical signal having an intensity profile that is arranged as a substantially off-axis intensity profile, the optical device, the connector, and the substantially planar HCG lens being arranged to mitigate coupling of a reflected optical signal associated with the converted optical signal that is reflected between the optical device and the optical fiber based on the substantially off-axis intensity profile, wherein the substantially off-axis intensity profile spatially isolates an optical mode of the reflected optical signal from the aperture, and the substantially planar HCG lens selectively phase-delays portions of the optical signal to provide the converted optical signal having a mode-isolating intensity profile.

14. The package of claim 13, wherein the substantially planar HCG lens comprises a plurality of resonant structures that are defined by a plurality of gradient patterns along a radius of the substantially planar HCG lens, the plurality of resonant structures being provided as a plurality of posts arranged on a substrate, the plurality of posts within each of the plurality of gradient patterns having a width or a density of population on the substrate that is defined by a gradient, such that the one of the width and the density of population of the plurality of posts decreases in a direction extending radially outward from a center of the substantially planar HCG lens in each given one of the plurality of gradient patterns.

15. The method of claim 10, wherein the intensity profile of the optical signal is arranged as a substantially off-axis intensity profile.

16. The method of claim 10, wherein the optical signal source is a vertical-cavity surface-emitting laser (VCSEL), and wherein the optical element is a multi-mode optical fiber.

17. The package of claim 14, wherein the plurality of resonant structures are fabricated from a first material and are substantially surrounded by a second material, wherein a difference between an index-of-refraction of the first material and an index-of-refraction of the second material is greater than or equal to one.

18. The package of claim 13, wherein the optical device is a vertical-cavity surface-emitting laser (VCSEL).

* * * * *